(12) United States Patent
Seo et al.

(10) Patent No.: US 7,407,422 B2
(45) Date of Patent: *Aug. 5, 2008

(54) LIGHT EMITTING DEVICE AND MANUFACTURING METHOD THEREFOR

(75) Inventors: Satoshi Seo, Kanagawa-Ken (JP); Hiroko Yamazaki, Kanagawa-Ken (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/426,146

(22) Filed: Jun. 23, 2006

(65) Prior Publication Data

US 2006/0234416 A1 Oct. 19, 2006

Related U.S. Application Data

(63) Continuation of application No. 10/992,854, filed on Nov. 22, 2004, now Pat. No. 7,075,228, which is a continuation of application No. 10/456,609, filed on Jun. 9, 2003, now Pat. No. 6,838,836.

(30) Foreign Application Priority Data

Jun. 28, 2002 (JP) ............................. 2002189998

(51) Int. Cl.
*H01J 1/62* (2006.01)
*H01J 63/04* (2006.01)

(52) U.S. Cl. .................. 445/24; 313/506; 313/505; 313/504

(58) Field of Classification Search ......... 313/498–512; 445/24–25
See application file for complete search history.

(56) References Cited

U.S. PATENT DOCUMENTS 5,719,467 A 2/1998 Antoniadis (Continued)

FOREIGN PATENT DOCUMENTS

CN 1 293 826 5/2001

(Continued)

OTHER PUBLICATIONS

European Search Report (Application No. 03014751.6) dated Jan. 11, 2007, 3 pages.

(Continued)

*Primary Examiner*—Mariceli Santiago
*Assistant Examiner*—Anthony Perry
(74) *Attorney, Agent, or Firm*—Fish & Richardson P.C.

(57) ABSTRACT

To provide a light emitting element having a top emission structure, which can be easily manufactured without considering an ionization potential of an electrode (particularly an electrode in contact with a substrate) and a manufacturing method therefor. A light emitting device having the top emission structure according to the present invention includes: a first electrode (101) formed of general-purpose metal (specifically, a wiring material such as Ti or Al) having a light-shielding property or reflectivity; a conductive polymer layer (102) formed by applying a conductive polymer material onto the first electrode (101); an electroluminescence film (103) formed in contact with the conductive polymer layer (102); and a light-transmissive second electrode (104) formed on the electroluminescence film 103, in which the conductive polymer layer (102) is formed of materials including a redox polymer etc., while being free of problems regarding work function (as shown in FIG. 1A).

56 Claims, 8 Drawing Sheets

U.S. PATENT DOCUMENTS

| | | | |
|---|---|---|---|
| 6,013,384 | A | 1/2000 | Kido |
| 6,235,414 | B1 | 5/2001 | Epstein |
| 6,475,845 | B2 | 11/2002 | Kimura |
| 6,605,904 | B2 | 8/2003 | Jenekhe |
| 6,838,836 | B2 | 1/2005 | Seo |
| 6,897,473 | B1 | 5/2005 | Burroughes et al. |
| 7,078,251 | B2 | 7/2006 | Burroughes et al. |
| 7,227,180 | B2 | 6/2007 | Burroughes et al. |
| 2003/0022409 | A1 | 1/2003 | Epstein |
| 2003/0127967 | A1 | 7/2003 | Tsutsui et al. |
| 2003/0170491 | A1 | 9/2003 | Liao et al. |
| 2003/0227253 | A1 | 12/2003 | Seo et al. |
| 2005/0029933 | A1 | 2/2005 | Liao et al. |
| 2006/0246613 | A1 | 11/2006 | Burroughes et al. |
| 2006/0263917 | A1 | 11/2006 | Burroughes et al. |

FOREIGN PATENT DOCUMENTS

| | | |
|---|---|---|
| EP | 1 318 553 | 6/2003 |
| EP | 1 331 667 | 7/2003 |
| EP | 1 339 112 | 8/2003 |
| JP | 2001-43980 | 2/2001 |

OTHER PUBLICATIONS

C.J. Lee et al.; "P-73: Effect of Metal Anodes for Top Emission PLED"; *EURODISPLAY 2002*; pp. 663-665; 2002.

Homer Antoniadis et al.; "Effects of Hole Carrier Injection and Transport in Organic Light-Emitting Diodes"; *IEEE Transactions on Electron Devices*, vol. 44, No. 8; pp. 1289-1294; Aug. 8, 1997.

M. Fujihira et al.; "Improvement in electron and hole injection at electrodes and in recombination at a two-organic-layer interface"; *Materials Science & Engineering B85*; pp. 203-208; 2001.

Tatsuya Sasaoka et al.; "24.4L: Late-News Paper: A 13.0-inch AM-OLED Display with Top Emitting Structure and Adaptive Current Mode Programmed Pixel Circuit (TAC)"; *SID 01 DIGEST*; pp. 384-387; 2001.

T.A. Beierlein et al.; "Kelvin probe investigations of metal work functions and correlation to device performance of organic light-emitting devices"; *Synthetic Metals 111-112*; pp. 295-297; 2000.

J.S. Kim; "Improved operational stability of polyfluorene-based organic light-emitting diodes with plasma-treated indium-tin-oxide anodes"; *Applied Physics Letters*, vol. 74, No. 21; pp. 3084-3086; May 24, 1999.

LIGHT EMITTING DIRECTION

LIGHT EMITTING DIRECTION

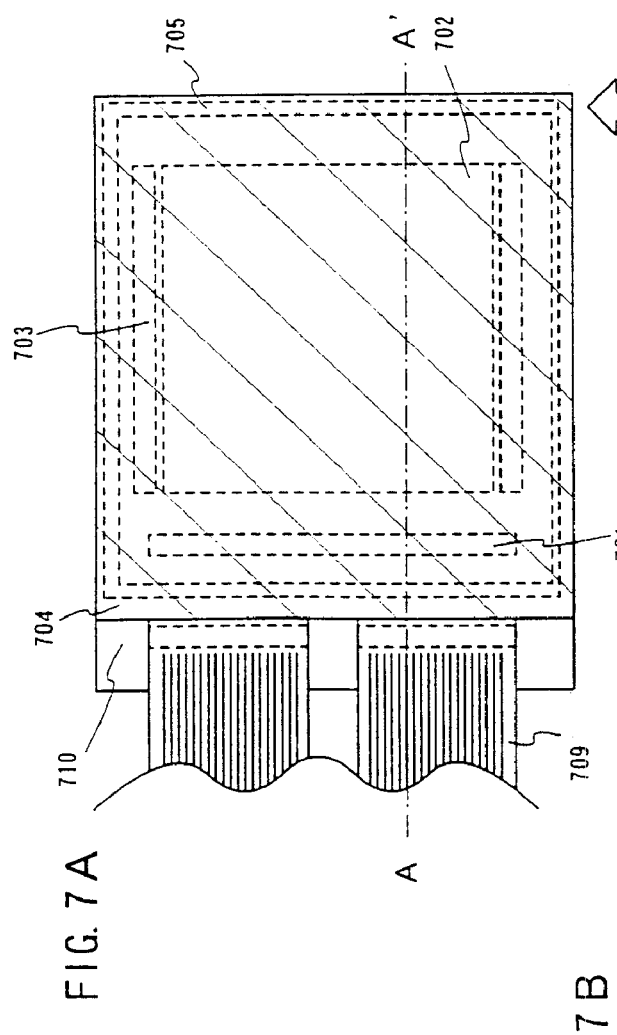
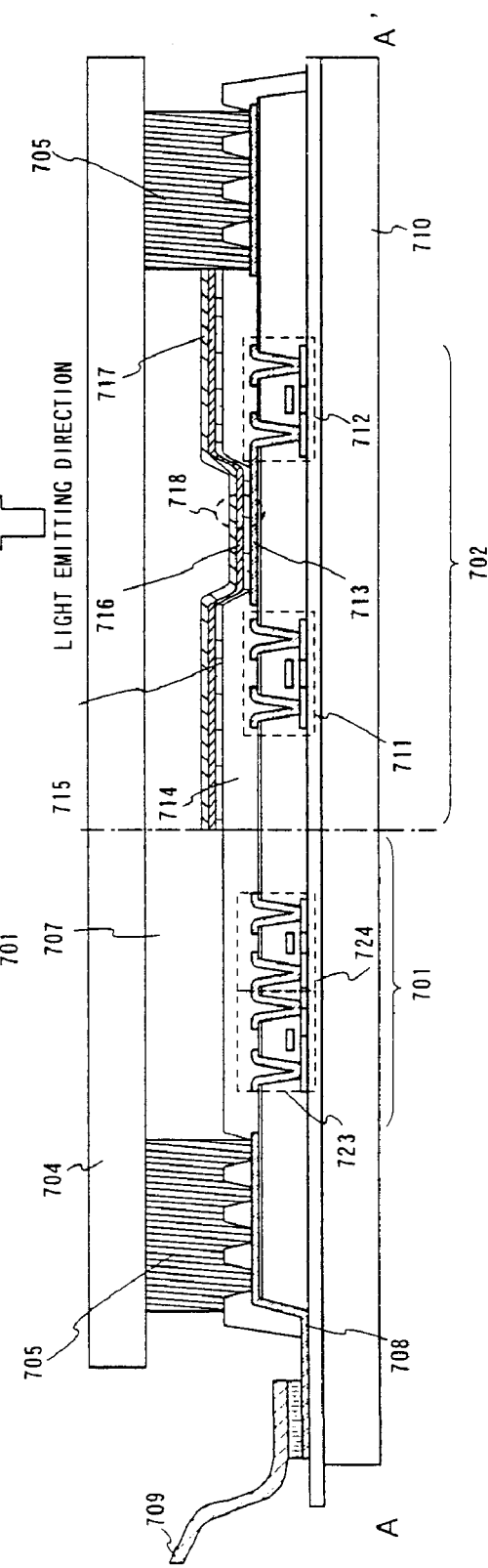
FIG. 7A
FIG. 7B

LIGHT EMITTING DEVICE AND MANUFACTURING METHOD THEREFOR

BACKGROUND OF THE INVENTION

1. Field of the Invention

The present invention relates to a light emitting device with a light emitting element that emits fluorescent light or phosphorescent light upon application of electric field to a pair of electrodes of the element which sandwich a organic compound-containing layer (hereinafter, an electroluminescence film), and to a method of manufacturing the light emitting device. In the present invention, the term light emitting device includes an image display device using a light emitting element, a light emitting device and a light source (including illuminating device). Also, the following modules are included in the definition of the light emitting device: a module obtained by attaching to a light emitting device a connector such as an FPC (flexible printed circuit; terminal portion), a TAB (tape automated bonding) tape, or a TCP (tape carrier package); a module in which a printed wiring board is provided at an end of the TAB tape or the TCP; and a module in which an IC (integrated circuit) is directly mounted to a light emitting element by the COG (chip on glass) system.

2. Description of the Related Art

Light emitting elements, which employ materials as light emitting member and are characterized by their thinness and light-weight, fast response, and direct current low voltage driving, are expected to develop into next-generation flat panel displays. Among display devices, ones having light emitting elements arranged to form a matrix shape are considered to be particularly superior to the conventional liquid crystal display devices for their wide viewing angle and excellent visibility.

It is said that light emitting elements emit light through the following mechanism: a voltage is applied between a pair of electrodes that sandwich a light emitting layer comprising an organic material, electrons injected from the cathode and holes injected from the anode are re-combined at the luminescent center of the electroluminescence film to form molecular excitons, and the molecular excitons return to the base state while releasing energy to cause the light emitting element to emit light. Known as excitation states are singlet excitation and triplet excitation, and it is considered that luminescence can be conducted through either one of those excitation states.

Such light emitting devices having can be arranged to form a matrix can employ passive matrix driving (simple matrix light emitting devices), active matrix driving (active matrix light emitting devices), or other driving methods. However, if the pixel density is increased, active matrix light emitting devices in which each pixel (or each dot) has a switch are considered as advantageous because they can be driven with low voltage.

As an active matrix light emitting device, it is generally that a thin film transistor (hereinafter, TFT) is formed on an insulating film, then, a light emitting element that is connected electrically to TFT is formed via an interlayer insulating film that is formed on the TFT. In addition, the light emitting element is composed of an anode, a cathode, an electroluminescence film, and a cathode.

The mainstream structure of conventional active matrix light emitting device is a bottom emission structure that light generated in an electroluminescence film in a light emitting element composed of an anode connected electrically to TFT, an electroluminescence film, and a cathode in this order (the normally laminated form) is emitted through an anode to a TFT side (that is, a substrate side). Thus, the material for an anode in this case is a conductive material that transmits visible light and has a large ionization potential (which has the same value as that of a work function in case of metal) is used, typically, indium tin oxide, indium zinc oxide.

However, there is a problem in that an opening ratio is restricted depending on a position of a TFT, wirings, or the like when resolution is to be improved. In recent years, the top emission structure that emits light through a cathode side (an electrode side that is formed on an electroluminescence film and positioned opposite to a substrate) is brought to attention, for example, patent reference 1: Kokai 2001-43980.

However, in manufacturing a light emitting device of a top emission structure, in a case of using a transparent conductive film made of ITO or the like, which is appropriate as an anode material for a light emitting element when forming the normally laminated ones as described above, problems arise in that visible light is allowed to pass therethrough, which leads to light leak on a substrate side. Therefore, according to such a merit that an ionization potential is large and conductivity is achieved, when the transparent conductive film is used as an anode of the top emission element in the normally laminated form, there is a need to shield the light by forming a material into a film, through which the light cannot pass, below the transparent conductive film or the like, resulting in a complicated process.

Also, when using a metal film as the anode of the light emitting element in the normally laminated form, which is of the top emission structure, the light can be shielded. Considering materials having ionization potentials as high as ITO exhibits, however, noble metals such as gold and platinum only suffice for the above requirement, which causes problems in terms of costs. Also, there arises a problem in that the metal exhibits poor adhesion to materials for forming an electroluminescence film.

On the other hand, provided that an electrode electrically connected with a TFT serves as a cathode and the light emitting element (in the reversely laminated form) formed by sequentially laminating the electroluminescence film and the anode on the cathode is used to attain the top emission structure, the anode may be made of ITO. Thus, it becomes easy to take out the light from the top surface. In this case, however, the metal having the low ionization potential is used as the cathode, which causes a problem in that the adhesion to the materials for forming the electroluminescence film is insufficient to thereby make it difficult to inject electrons thereinto.

That is to say, regarding the light emitting element having the top emission structure in either normally or reversely laminated ones, the above-mentioned difficulty is involved due to the limitations of ionization potential of the electrode.

SUMMARY OF THE INVENTION

In view of the aforementioned problems, an object of the present invention is to provide a light emitting element having a top emission structure, which can be easily manufactured without taking into consideration an ionization potential of an electrode (in particular, an electrode in contact with a substrate) and a manufacturing method therefor. In addition, another object of the present invention is to provide a light emitting device that can be manufactured with high efficiency at low costs by using the light emitting element.

Accordingly, the inventors of the present invention have devised a light emitting device of a top emission structure as shown in FIG. 1A, which includes: a first electrode 101 made of general-purpose metal having a light-shielding property or reflectivity (typically, a wiring material such as Ti or Al); a conductive polymer layer 102 formed by applying onto the first electrode 101 a conductive polymer material; an electroluminescence film 103 formed in contact with the conductive polymer layer 102; and a light-transmissive second electrode 104 formed on the electroluminescence film 103 while being free of problems regarding work function.

Note that the present invention is characterized by adopting as materials for forming the conductive polymer layer 102 a redox polymer (oxidation-reduction polymer) having a function of taking carriers out of the first electrode 101 brought into contact with the conductive polymer layer 102; or a polymer doped with a dopant (donor or acceptor) for increasing existence probability of the carriers.

Note that when using the redox polymer for the conductive polymer layer 102, a reaction shown in FIG. 1B develops at an interface with the first electrode 101. First, in the case where the first electrode 101 becomes the anode, the redox polymer functions as a reluctant and thus, serves to take holes out of the first electrode 101 (in other words, emit electrons) at the interface with the first electrode 101. As a result, the redox polymer itself exists as the carrier (hole). On the other hand, in the case where the first electrode 101 becomes the cathode, the redox polymer functions as an oxidant and thus, serves to take the electrons out of the first electrode 101 at the interface with the first electrode 101. As a result, the redox polymer itself exists as the carrier (electron). Consequently, when the first electrode 101 becomes either the anode or the cathode, the redox polymer serves to take the carriers out of the first electrode 101, thereby enhancing a property of injecting the carriers from the first electrode 101.

Also, in the case of using for the conductive polymer layer 102 the polymer doped with the dopant, when the first electrode 101 serves as the anode, the polymer doped with an acceptor molecule as the dopant is used, whereas when the first electrode 101 serves as the cathode, the polymer doped with a donor molecule as the dopant is used.

FIG. 1C is a conceptual view for showing the case where the acceptor molecule is doped in the conductive polymer layer 102. In this case, the first electrode (anode) 101 serves to take out the electrons from the acceptor level existing in the conductive polymer and at the same time, inject the holes in the conductive polymer layer to the acceptor level. Note that the holes thus injected move to an HOMO level in the conductive polymer layer and further to the HOMO level in the electroluminescence film 103. Here, in this case, the movement from the first electrode 101 to the conductive polymer layer easily takes place since there is hardly involved energy difference. Furthermore, as to the movement of the injected holes from the acceptor level to the HOMO level in the electroluminescence film 103 as well, the energy difference is reduced as compared with the case of directly injecting the holes from the first electrode 101. As a result, it is possible to increase the property of injecting the holes from the first electrode.

FIG. 1D is a conceptual view for showing the case where the donor molecule is doped in the conductive polymer layer 102. In this case, the electrons are injected from the first electrode (cathode) 101 to the donor level existing in the conductive polymer layer 102. Note that the electrons thus injected move to an LUMO level in the conductive polymer layer 102 and further to the LUMO level in the electroluminescence film 103. Here, in this case, the movement from the first electrode 101 to the conductive polymer layer easily takes place since there is hardly involved energy difference. Furthermore, as to the movement of the injected electrons from the LUMO level in the conductive polymer layer 102 to the LUMO level in the electroluminescence film 103 as well, the energy difference is reduced as compared with the case of directly injecting the electrons from the first electrode 101. As a result, it is possible to increase the property of injecting the electrons from the first electrode.

Further, according to a structure of the present invention, there is provided a light emitting device including:
a first electrode;
a conductive polymer layer;
an electroluminescence film; and
a second electrode, characterized in that:
the conductive polymer layer is made of a redox polymer and formed between the first electrode and the electroluminescence film in contact therewith; and
the second electrode is formed of a transparent conductive film.

Also, in the above structure, the light emitting device is characterized in that:
when the first electrode is made to function as an anode, the hole transporting layer out of the hole transporting layer and the electron transporting layer, which both constitute the electroluminescence film, is formed in contact with the conductive polymer layer; and
the second electrode is formed of a material small in work function (specifically, the work function of 3.5 eV or less being preferably used).

Also, in the above structure, the light emitting device is characterized in that:
when the first electrode is made to function as a cathode, the electron transporting layer out of the hole transporting layer and the electron transporting layer, which both constitute the electroluminescence film, is formed in contact with the conductive polymer layer, and
the second electrode is formed of a material large in work function (specifically, the work function of 4.0 eV or more being preferably used).

Further, according to another structure of the present invention, there is provided a light emitting device including:
a first electrode;
a conductive polymer layer;
an electroluminescence film; and
a second electrode, characterized in that:
the first electrode functions as an anode;
the conductive polymer layer is made of a conductive polymer material doped with an acceptor material and formed between the first electrode and the electroluminescence film in contact therewith; and
the second electrode is formed of a transparent conductive film.

Also, in the above structure, the light emitting device is characterized in that:
when the first electrode is made to function as an anode, the first electrode is preferably formed of a material large in work function and the electron transporting layer out of the hole transporting layer and the electron transporting layer, which both constitute the electroluminescence film, is formed in contact with the conductive polymer layer, and
the second electrode is formed of a material small in work function.

Further, according to another structure of the present invention, there is provided a light emitting device including:
a first electrode;
a conductive polymer layer;
an electroluminescence film; and
a second electrode, characterized in that:
the first electrode functions as a cathode;

the conductive polymer layer is made of a conductive polymer material doped with a donor material and formed between the first electrode and the electroluminescence film in contact therewith; and the second electrode is formed of a transparent conductive film.

Also, in the above structure, the light emitting device is characterized in that:

when the first electrode is made to function as a cathode, the first electrode is preferably formed of a material small in work function and the hole transporting layer out of the hole transporting layer and the electron transporting layer, which both constitute the electroluminescence film, is formed in contact with the conductive polymer layer, and the second electrode is formed of a material large in work function.

In the above structures, the electroluminescence film can be made of known materials and formed by using low molecular weight organic or inorganic materials or polymeric organic or inorganic materials in the form of single layer or laminate in which the plural materials are used in combination.

With the above structure, the light emitting element can be formed without considering the work function of the electrode material formed in contact with the conductive polymer layer unlike the conventional cases. Thus, the selection range of the electrode materials can be widened. For example, when manufacturing the light emitting device having the light emitting element connected with the TFT, wirings for electrically connecting between the TFT and the light emitting element can double as the electrode of the light emitting element, so that the process can be simplified as compared with the case where the electrode and the wiring are manufactured in different steps. As a result, low costs can be realized along with improvement in yield.

BRIEF DESCRIPTION OF THE DRAWINGS

In the accompanying drawings:

FIGS. 7A and 7B are explanatory views of a light emitting device; and

DETAILED DESCRIPTION OF THE PREFERRED EMBODIMENTS

Embodiment Mode

Hereinafter, Embodiment Mode of the present invention will be described.

Embodiment Mode 1

Figure 1A:
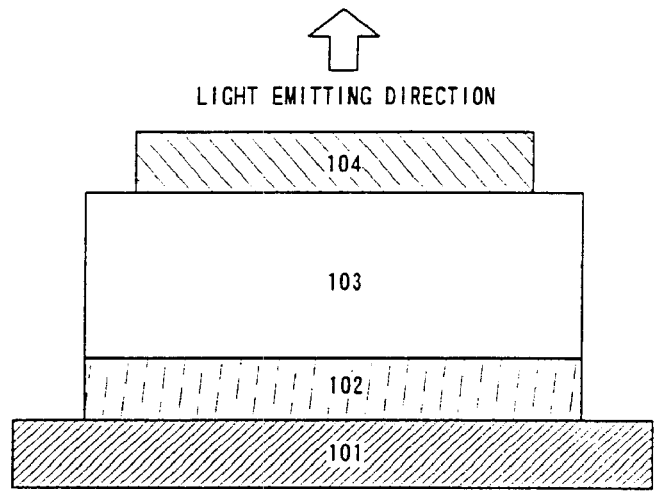
FIGS. 1A to 1D are explanatory views of an element structure of a light emitting element according to the present invention.
Figure 1B:
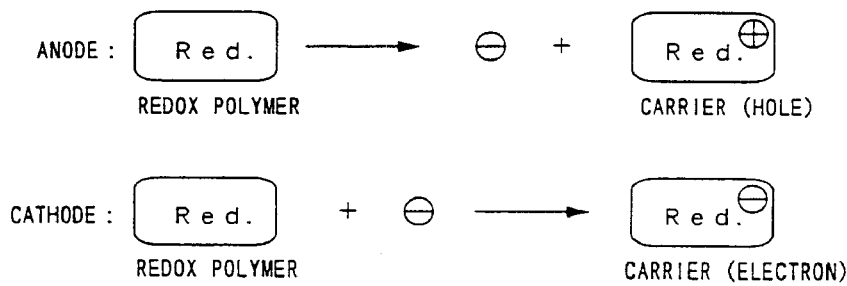
Figure 1C:
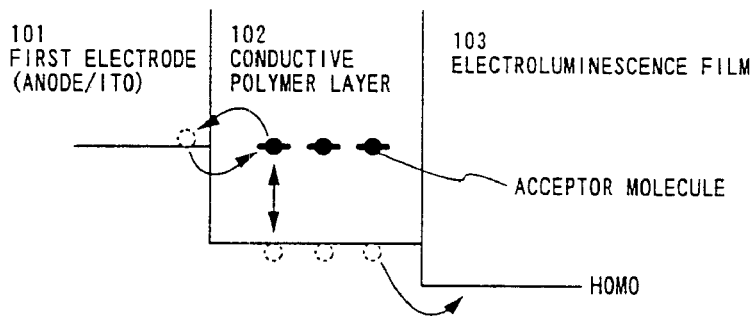
Figure 1D:
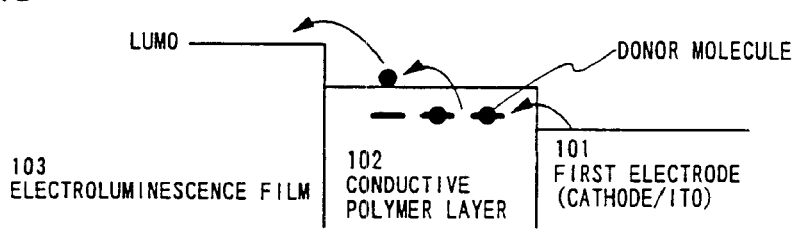
Figure 2A:
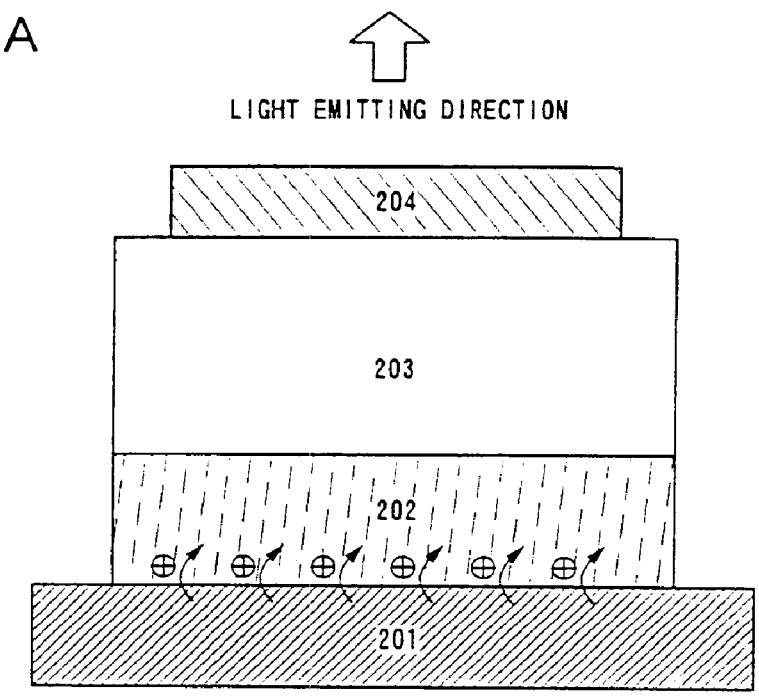
FIGS. 2A and 2B are explanatory views of an element structure of a light emitting element in which a first electrode serves as an anode.

In Embodiment Mode 1, the case will be described with reference to FIG. 2 in that a redox polymer layer 202 made from redox polymer is formed as a conductive polymer layer on a first electrode 201, an electroluminescence film 203 on the redox polymer layer 202, and a second electrode 204 is formed thereon.

Figure 2B:
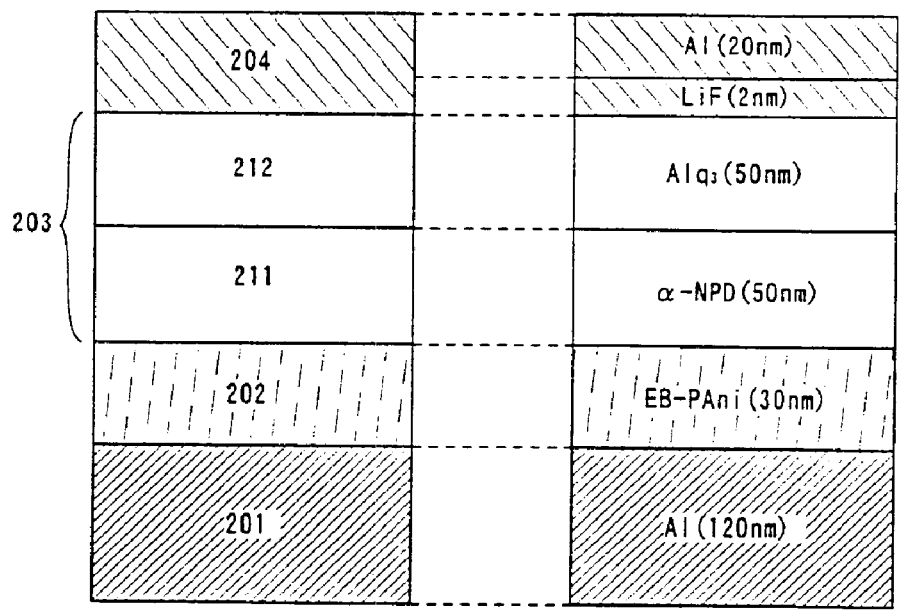

The first electrode 201 is usually formed from an anode material having high work function since the first electrode 201 functions as an anode, however, since the first electrode 201 is formed in contact with the redox polymer layer 202 in this embodiment, materials having high work function are not necessary to be used. It is preferable that a metal material is used that give the first electrode 201 light blocking effects or light reflecting effects. Specifically, Al can be formed to have a thickness of approximately 120 nm as shown in FIG. 2B.

The redox polymer layer 202 is formed on the first electrode 201. In addition, emeraldine base polyaniline (hereinafter, EB-PAni) can be used for forming the redox polymer layer 202. The redox polymer layer 202 is formed to have a thickness of 20 to 50 nm (preferably, 30 nm). In addition, another known redox polymer can be also used.

The electroluminescence film 203 is formed on the redox polymer layer 202. The electric light emitting film 203 can be formed with one kind of material but also plural kinds of materials to have a lamination structure.

If the electroluminescence film 203 has a lamination structure, it may be formed with a hole injection layer, a hole transporting layer, a light emitting layer, a hole blocking layer, an electron transporting layer, an electron injection layer. At least one luminescent layer is necessary to be included thereinto.

In Embodiment Mode 1, the electroluminescence film 203 can be formed to compose a hole transporting layer 211 and an electron transporting layer 212 in a lamination structure. Specifically, the hole transporting layer 211 can be formed with 4,4'-bis[N-(1-naphthyl)-N-phenyl-amino]-biphenyl (hereafter referred to as α-NPD) to have a thickness of 50 nm, which has hole transporting characteristics, the electron transporting layer 212 can be formed with tris(8-quinolinate) aluminum (hereafter referred to as $Alq_3$) to have a thickness of 50 nm, which has electron transporting characteristics. In this lamination structure, $Alq_3$ that forms the electron transporting layer 212 has a luminescent property.

Next, the second electrode 204 is formed on the electroluminescence film 203. The second electrode 204 is formed with cathode materials having a low work function since it serves as a cathode. The cathode 204 may be a single layer structure formed with a one kind of material, but also lamination structure formed with plural kinds of materials. Embodiment Mode 1 shows that the cathode 204 is formed by laminating lithium fluoride (LiF) having 2 nm in thick and aluminum (Al) having 20 nm in thick with reference to FIG. 2B. In addition, LiF can decrease the work function of the cathode 204, and Al can increase the conductivity of the cathode 204, so that the cathode has at the same time these plural functions. In addition, materials having a low work function can be freely combined for forming the cathode.

The second electrode 204 is necessary to have transmittance that is enough to pass visible light, since it should be transparent to the light generated in the electroluminescence film 203 and communicate the light output to the light emitting device. Specifically, it is preferable that second electrode 204 has a transmittance of more than 30% for visible light.

Embodiment Mode 2

Figure 3A:
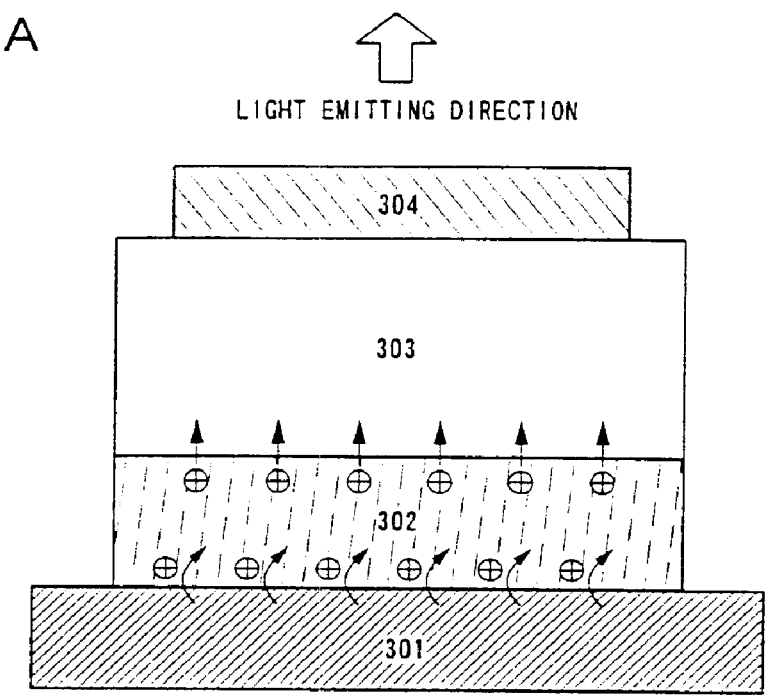
FIGS. 3A and 3B are explanatory views of an element structure of a light emitting element in which a first electrode serves as an anode.

In Embodiment Mode 2, the case in which a doping layer 302 that is polymer doped with dopant is formed as a conductive polymer molecular layer on a first electrode 301, and a second electrode 304 is formed thereon as shown in FIG. 3A will be described.

The first electrode 301 serves as an anode in Embodiment Mode 2 as well as Embodiment Mode 1. Materials for forming the first electrode 301 are preferable to have a high work function (specifically, materials having at least 4.0 eV work function).

Next, a doping layer 302 is formed on the first electrode 301. The doping layer 302 described in Embodiment Mode 2 is p-type, and made from polymer materials and dopant that is an acceptor molecule. Specifically, the doping layer 302 is made from polymer materials that polyethylenedioxythiophene (hereinafter, PEDOT) doped with polystyrene sulphonic acid (hereinafter, PSS) to have a thickness of 20 to 50 nm (preferably, 30 nm). Another known materials can also be used as polymer materials and dopant that is an acceptor molecule.

Next, an electroluminescence film 303 is formed on the doing layer 302. The electroluminescence film 303 may be formed using one kind of material, and also plural kinds of materials to have a lamination structure.

If the electroluminescence film 303 has a lamination structure, it may be formed with a hole injection layer, a hole transporting layer, a light emitting layer, a hole blocking layer, an electron transporting layer, an electron injection layer. At least one luminescent layer is necessary to be included thereinto.

Figure 3B:
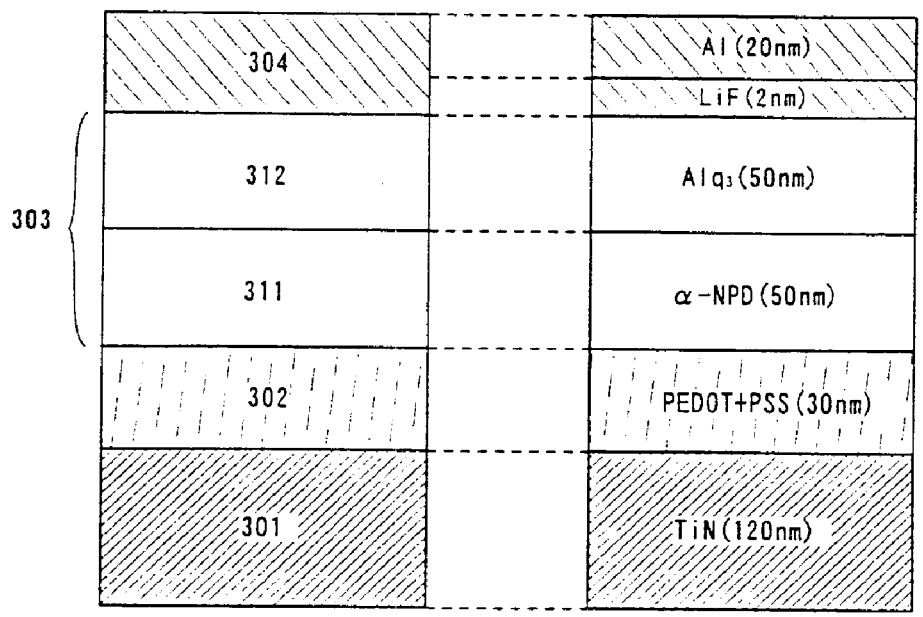

In Embodiment Mode 2, the electroluminescence film 303 is formed to compose a hole transporting layer 311 and an electron transporting layer 312 in a lamination structure as shown in FIG. 3B. Specifically, a hole transporting layer 311 is made from α-NPD to have a thickness of 50 nm, and an electron transporting layer 312 is made from $Alq_3$ to have a thickness of 50 nm. In this lamination structure, $Alq_3$ that forms the electron transporting layer 312 is luminescent.

Then, a second electrode 304 is formed on an electroluminescence film 303. Serving as a cathode, the second electrode 304 is made from cathode materials with a low work function. In addition, the cathode 304 can be formed with one kind of material but also plural kinds of materials to have a lamination structure. In Embodiment Mode 2, the case in which the cathode 304 is formed by stacking LiF 2 nm in thick, and Al in 20 nm in thick will be described as shown in FIG. 3B. Thereby, the electrode has plural functions at the same time that can reduce work function of the cathode 304 by using LiF, and increase conductivity thereof by using Al. The cathode is made from known materials having a low work function that are freely combined.

The second electrode 304 is necessary to have transmittance that is enough to pass visible light, since it should be transparent to the light generated in the electroluminescence film 303 and communicate the light output to the light emitting device. Specifically, it is preferable that second electrode 304 has a transmittance of more than 30% for visible light.

Embodiment Mode 3

Figure 4A:
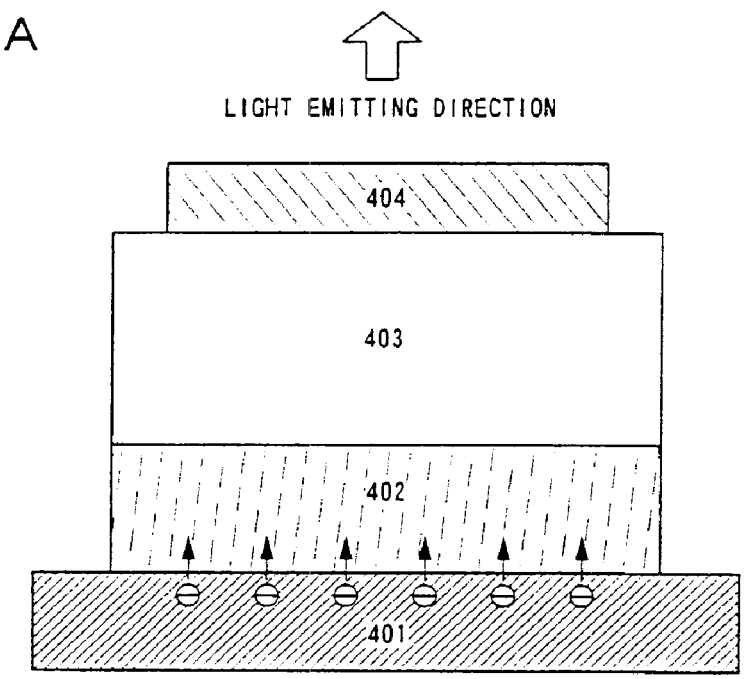
FIGS. 4A and 4B are explanatory views of an element structure of a light emitting element in which a first electrode serves as a cathode.

In Embodiment Mode 3, the case in which a redox polymer layer 402 made from redox polymer is formed as a conductive polymer layer on a first electrode 401, an electroluminescence film 403 is formed thereon, and a second electrode 404 is formed thereon as shown in FIG. 4A will be described.

Figure 4B:
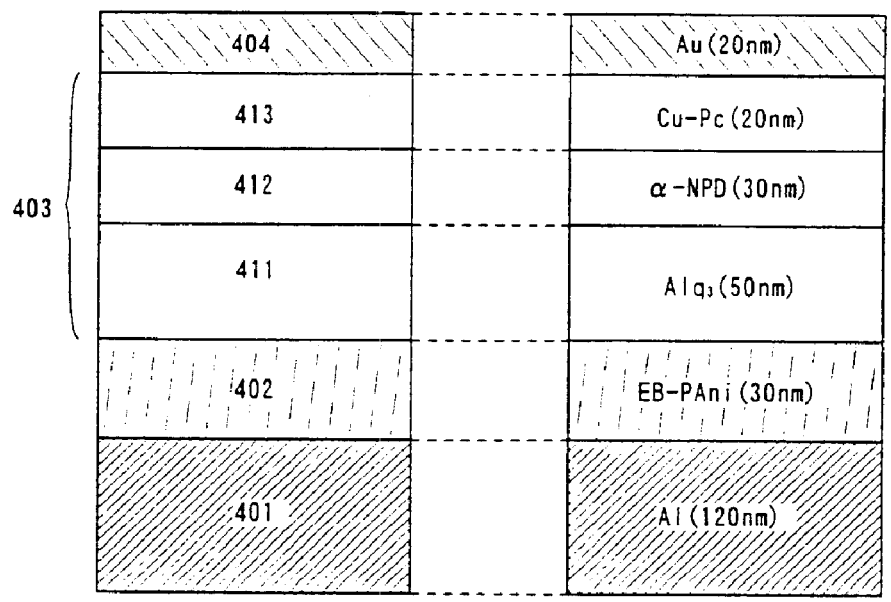

Serving as a cathode, the first electrode 401 is generally made from cathode materials with a low work function. However, since the first electrode 401 is formed in contact with the redox polymer layer 402, it is not necessary to use materials with a low work function. In the present invention, it is preferable: that a metal material is used that give the first electrode 401 light blocking effect or light reflective effects. Specifically, Al can be formed as the first electrode 401 to have approximately a 120 nm thickness as shown in FIG. 4B.

The redox polymer layer 402 is formed on the first electrode 401. Further, the redox polymer layer 402 is made from EB-PAni to have a thickness of 25 to 50 nm (preferably, 30 nm). In addition, known redox polymer can be used.

Then, the electroluminescence film 403 is formed on the redox polymer 402. The electroluminescence film 403 may be formed using one kind of material, and also plural kinds of materials to have a lamination structure.

Further, if the electroluminescence film 403 has a lamination structure, it may be formed with a hole injection layer, a hole transporting layer, a light emitting layer, a hole blocking layer, an electron transporting layer, an electron injection layer. At least one luminescent layer is necessary to be included thereinto.

In Embodiment Mode 3, as shown in FIG. 4B, an electron transporting layer 411, a hole transporting layer 412, and a hole injecting layer 413 are laminated to form an electroluminescence film 403. Specifically, the electron transporting layer 411 is formed of $Alq_3$ as a material having an electron transporting property with a thickness of 50 nm. The hole transporting layer 412 is formed of α-NPD as a material having a hole transporting property with a thickness of 30 nm. The hole injecting layer 413 is formed of Cu-Pc as a material having a hole injecting property with a thickness of 20 nm. Those layers constitute the laminate structure. Note that in the case of the laminate structure, $Alq_3$ used for forming the electron transporting layer 411 exhibits the light emitting property.

Following this, a second electrode 404 is formed on the electroluminescence film 403. Note that the second electrode 404 functions as the anode and thus, is formed of an anode material having the large work function. Here, the second electrode 404 may have either a single-layer structure composed or a single material or a laminate structure composed of plural materials. In Embodiment Mode 3, as shown in FIG. 4B, Au is deposited into a film having a thickness of 20 nm to obtain the second electrode. As an anode material for the second electrode 404, known materials having high work function can be freely combined.

The second electrode 404 is necessary to have transmittance that is enough to pass visible light, since it should be transparent to the light generated in the electroluminescence film 403 and communicate the light output to the light emitting device. Specifically, it is preferable that second electrode 304 has a transmittance of more than 30% for visible light.

Embodiment Mode 4

Figure 5A:
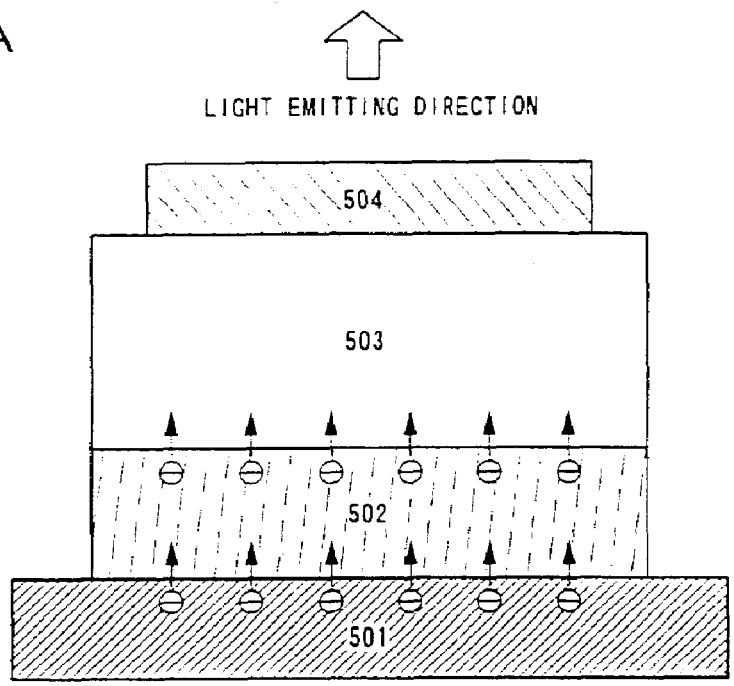
FIGS. 5A and 5B are explanatory views of an element structure of a light emitting element in which a first electrode serves as a cathode.

In Embodiment Mode 4, as shown in FIG. 5A, a description will be given of a case where a doping layer 502 obtained by doping a dopant into a polymer as a conductive polymer layer is formed on a first electrode 501 and a second electrode 504 is formed thereon.

Similarly to Embodiment Mode 3, in Embodiment Mode 4, the first electrode 501 functions as a cathode. Here, the first electrode 501 is preferably formed of materials having a small work function (specifically, materials having the work function of 3.5 eV or less).

Next, the doping layer 502 is formed on the first electrode 501. Note that the doping layer 502 of Embodiment Mode 4 is of n-type conductivity. The doping layer is formed of a polymer material and a dopant as a donor molecule. To be specific, EB-PAni serving as a redox polymer as well as the polymer material, which is doped with tetrathiafluvalene (hereinafter, referred to as TTF) can be used therefor. It is formed with a thickness of 20 to 50 nm (preferably, 30 nm). Note that, as the polymer material and the dopant as the donor molecule, other known materials can be adopted.

Next, the electroluminescence film 503 is formed on the doping layer 502. The electroluminescence film 503 may be formed of a single material but may have a laminate structure composed of plural materials.

Further, in the case of adopting the laminate structure, layers having various functions, such as a hole injecting layer, a hole transporting layer, a light emitting layer, a hole blocking layer (blocking layer), an electron transporting layer, and an electron injecting layer, are combined. The laminate structure may include at least the layer having the light emitting property.

Figure 5B:
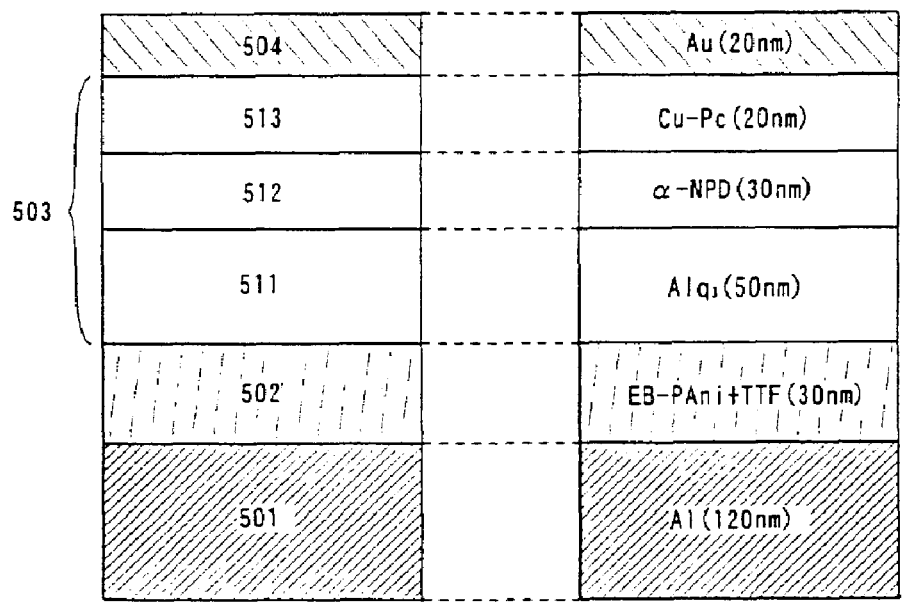

In Embodiment Mode 4, as shown in FIG. 5B, an electron transporting layer 511, a hole transporting layer 512, and a hole injecting layer 513 are laminated to form an electroluminescence film 503. Specifically, the electron transporting layer 511 is formed of $Alq_3$ as a material having an electron transporting property with a thickness of 50 nm. The hole transporting layer 512 is formed of α-NPD as a material having a hole transporting property with a thickness of 30 nm. The hole injecting layer 513 is formed of Cu-Pc as a material having a hole injecting property with a thickness of 20 nm. Those layers constitute the laminate structure. Note that in the case of the laminate structure, $Alq_3$ used for forming the electron transporting layer 511 exhibits, the light emitting property.

Following this, a second electrode 504 is formed on the electroluminescence film 503. Note that the second electrode 504 functions as the anode and thus, is formed of an anode material having the large work function. Here, the second electrode 504 may have either a single-layer structure composed of a single material or a laminate structure composed of plural materials. In Embodiment Mode 4, as shown in FIG. 5B, Au is deposited into a film having a thickness of 20 nm to obtain the second electrode.

Also, the second electrode 504 to be formed in this case is needed to allow the light emitted from the electroluminescence film 503 to pass therethrough to the outside and thus, it should ensure transmissivity high enough for visible light to pass therethrough. To be specific, it is preferable that the transmissivity of the visible light be equal to or more than 30%.

Embodiments

Hereinafter, embodiments of the present invention will be described.

Embodiment 1

Figure 6:
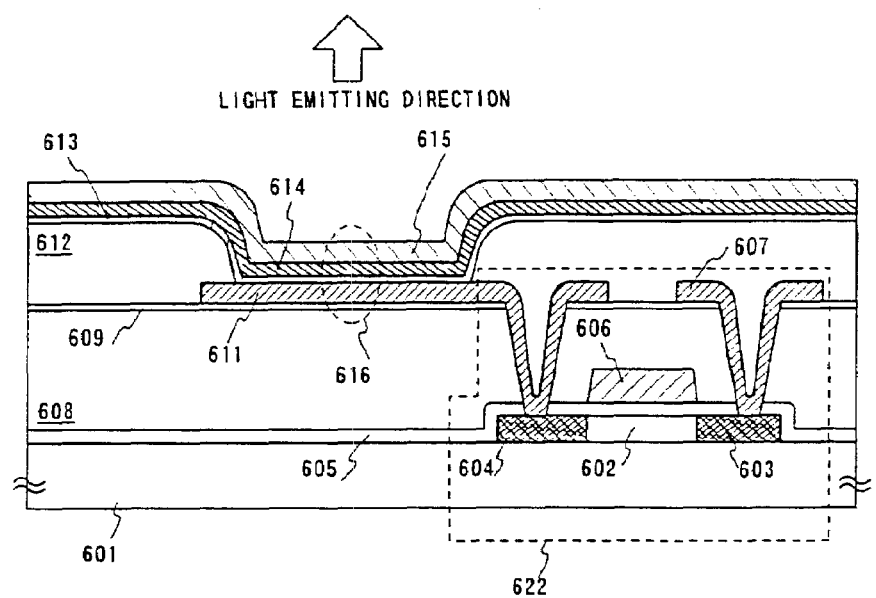
FIG. 6 is a sectional view for illustrating a structure of a light emitting element connected with a TFT.

In this embodiment, an example of forming a light emitting panel in which TFT on a substrate having an insulating surface is connected to a light emitting element is shown in FIG. 6. A cross-sectional view of one TFT that is connected to a light emitting element in a pixel portion is shown in this embodiment.

A semiconductor layer is formed on a substrate 601 having an insulating surface. In addition, although not shown here, a base insulating film made from lamination layer including an oxide silicon layer, a nitride silicon layer, or an oxynitride silicon layer can be formed on the substrate 601.

Subsequently, a semiconductor layer is formed as follows: an amorphous semiconductor film is formed by known means (a sputtering, an LPCVD, a plasma CVD, or the like), then, the film is crystallized by a known crystallization method (a laser crystallization method, a thermal crystallization method or a thermal crystallization method using a catalyst such as nickel), and then, the crystalline semiconductor film is patterned into a desired form. This semiconductor layer is formed in a thickness of 25 to 80 nm (preferably 30 to 60 nm). The material of the crystalline semiconductor film, although not limited in material, is preferably formed of silicon or a silicon-germanium alloy.

In the case of forming a crystalline semiconductor film by a laser crystallizing process, it is possible to use an excimer laser of a pulse-oscillation or continuous-oscillation type, a YAG laser, or an $YVO_4$ laser. In the case of using such laser, preferably used is a method that the laser light emitted from a laser oscillator is condensed by an optical system into a linear form to be irradiated onto the semiconductor film. The condition of crystallization is to be appropriately selected by those who implement the invention. In the case of using an excimer laser, pulse oscillation frequency is 30 Hz and laser energy density is 100 to 400 $mJ/cm^2$ (typically 200 to 300 $mJ/cm^2$). Meanwhile, in the case of using a YAG laser, preferably its second harmonic is used and pulse oscillation frequency is 1 to 10 kHz and laser energy density is 300 to 600 $mJ/cm^2$ (typically 350 to 500 $mJ/cm^2$). The laser light focused linear to a width of 100 to 1000 μm, e.g. 400 μm, is irradiated throughout the substrate entirety, whereupon the overlap ratio of linear laser beam may be taken 80 to 98%.

Then, the surface of the semiconductor layer is cleaned by an etchant containing a hydrogen fluoride, to form a gate insulating film 605 covering the semiconductor layer. The gate insulating film 605 is formed by an insulating film containing silicon having a thickness of 40 to 150 nm by the use of plasma CVD or sputtering. In this embodiment, a silicon oxide nitride film is formed (composition ratio: Si=32%, O=59%, N=7% and H=2%) to have a thickness of 115 nm by plasma CVD. Of course, the gate insulating film 605 is not limited to a silicon oxide nitride film but may be made another insulating films in a single layer or a laminated layer.

After cleaning the surface of the gate insulating film 605, a gate electrode 606 is formed. Then, a p-type providing impurity element (such as B), herein, adequate amounts of boron is added to the semiconductor to form a source region 603 and a drain region 604. After the addition of the impurity element, heating process, intense light radiation or laser irradiation is made in order to activate the impurity element. Simultaneously with activation, restoration is possible from the plasma damage to the gate insulating film or from the plasma damage at the interface between the gate insulating film and the semiconductor layer. Particularly, it is extremely effective to irradiate the second harmonic of a YAG laser at a main or back surface thereby activating the impurity element in an atmosphere at room temperature to 300° C. YAG laser is preferable activating means since it requires a few maintenances.

An insulating film 608 made form an organic material or an inorganic material is formed. Here, a case where a protection film 609 made from a silicon nitride film is formed after the interlayer insulating film 608 is formed using nonphotosensitive organic resin film will be described.

Then, contact holes that reach a source region 603 and a drain region 604 are formed. And then, a wiring 607 that is connected to the source region 603 and the drain region 604 are formed to complete a TFT 622 (a p-channel TFT). The TFT 622 will serve as a TFT which controls current which is supplied to a light emitting element 616. In this embodiment, the wiring that is connected to the drain region 604 also serves as a first electrode 611 of a light emitting element 616 that will be formed in the next.

The first electrode 611 serves as an anode or a cathode of the light emitting element 616. Next, an insulating layer (referred to as a bank, a barrier, or the like) 612 is formed to cover both side edges of the first electrode 611. The insulating layer 612 is made from photosensitive organic resin. Then, a conductive polymer layer 613 is formed on the first electrode 611, an electroluminescence film 614 is formed thereon, further, a second electrode 615 is formed thereon to complete the light emitting element 616. The second electrode 615 will serve as a cathode or an anode of the light emitting element, and polarized different from the first electrode 611.

In the present invention, materials for forming the first electrode 611 are conductive, since the first electrode is formed in contact with the conductive polymer layer 613. Further, the materials are required to have a light blocking effect or a reflectiveness for increasing light emitting efficiency. It is preferable in case that the first electrode serves as an anode that the materials have high work function (specifically, at least 4.0 eV work function), and in case that the first electrode serves as a cathode that the materials have low work function (specifically, at most 3.5 eV work function).

Specifically, materials having above-mentioned properties as the first electrode 611 include an element selected from aluminum (Al), tantalum (Ta), tungsten (W), titanium (Ti), molybdenum (Mo), nickel (Ni), copper (Cu), titanium (Ti), chrome (Cr), silver (Ag), or alloy which includes these elements. Materials having high work function include nitride or carbide of elements belonging to the fourth group, the fifth group, or sixth group in the periodic table of the elements such as titanium nitride (TiN), tantalum nitride (TaN), zirconium nitride (ZrN), molybdenum nitride (MoN), chrome nitride (CrN), tungsten nitride (WN), titanium carbide (TiC), tantalum carbide (TaC), zirconium carbide (ZrC), molybdenum carbide (MoC), or the like. Materials having low work function include alkali metals or metal materials a part of which include alkali metals. For example, aluminum-lithium alloy (Al:Li), magnesium-silver alloy (Mg:Ag) and a lamination of Al and LiF can be used.

In addition, in case where a redox polymer layer is formed as the conductive polymer layer 613 as shown in Embodiment Mode 1 and Embodiment Mode 3, EB-PAni or another known redox polymer (oxidation-reduction polymeric materials) are used as the conductive polymer layer 613. In case where a doping layer is formed as the conductive polymer layer 613 as shown in Embodiment Mode 2 and Embodiment Mode 4, PEDOT doped with PSS (p-doped polymer) or TFT doped with EB-PAni (n-doped polymer) are used as the conductive polymer layer 613. A solution for forming the conductive polymer layer 613 in which various kinds of materials are dissolved in a solvent such as water, n-methylpyrrolidone (NMP), dimethylsulfoxide (DMSO), or the like is deposited by coating or spin coating.

Known low molecular electroluminescence materials or high molecular electroluminescence materials are used as an electroluminescence film 614. In this embodiment, a case where the electroluminescence film 614 is deposited using low molecular electroluminescence material by evaporation will be described. The electroluminescence film 614 is formed to have a single structure made from one kind of material, and also a lamination structure made from plural materials. The lamination structure may include, but an organic compound layer in the present invention is not limited to, a hole transporting layer made from hole transporting materials, a light emitting layer made from luminous materials, and an electron transporting layer made from electron transporting materials. The lamination structure that includes hole injecting layer made from hole injecting materials and a hole blocking layer made from hole blocking material can be formed as an organic compound layer. Hereinafter, preferable materials are described, but materials for forming the electroluminescence film 614 of the present invention is not limited thereto.

As the hole transporting material used for forming the hole transporting layer, an aromatic amine-based (that is, the one having a benzene ring-nitrogen bond therein) compound is preferred. Widely used materials include, for example, in addition to the above-mentioned TPD, derivatives thereof such as 4,4'-bis[N-(1-naphthyl)-N-phenyl-amino]-biphenyl (hereafter, referred to as "α-NPD"). Also used are star burst aromatic amine compounds, including: 4,4',4"-tris(N,N-biphenyl-amino)-triphenyl amine (hereafter, referred to as "TDATA"); and 4,4',4"-tris[N-(3-methylphenyl)-N-phenyl-amino]-triphenyl amine (hereafter, referred to as "MTDATA").

Specific examples of the light emitting material used for forming the light emitting layer include metal complexes such as $Alq_3$, tris(8-quinolinolate) aluminum (hereafter, referred to as $Alq_3$), tris(4-methyl-8-qiuinolinolate) aluminium (hereafter, referred to as $Almq_3$), and bis (10-hydroxybenzo[h]-quinolinate) beryllium (hereafter, referred to as $BeBq_2$), and bis (2-methyl-8-quinolinolate)-(4-hydroxy-biphenylyl)-aluminum (hereafter, referred to as BAlq). The examples also include metal complexes including such as bis [2-(2-hydroxyphenyl)-benzooxazolate]zinc (hereafter, referred to as $Zn(BOX)_2$) and bis [2-(2-hydroxyphenyl)-benzothiazolate]zinc (hereafter, referred to as $Zn(BTZ)_2$). Also, fluorescent dyes thereof may be used. Triplet light emission materials may also be used and main examples thereof include complexes with platinum or iridium as central metal. Known triplet light emission materials include tris(2-phenylpyridine) iridium (hereafter, referred to as $Ir(ppy)_3$), 2,3,7,8,12,13,17,18-octaethyl-21H, and 23H-porphyrin-platinum (hereafter, referred to as PtOEP).

Metal complexes are often used as the electron transporting material. Preferred examples thereof include: metal complexes having a quinoline skeleton or benzoquinoline skeleton, such as the aforementioned $Alq_3$, $Almq_3$, $BeBq_2$; and mixed ligand complexes such as BAlq. Other examples include metal complexes having oxazole-based and thiazole-based ligands such as $Zn(BOX)_2$ and $Zn(BTZ)_2$. Other materials that are capable of transporting electrons than the metal complexes are: oxadiazole derivatives such as 2-(4-biphenyl)-5-(4-tert-butylphenyl)-1,3,4-oxadiazole (hereafter referred to as PBD), and 1,3-bis [5-(p-tert-butylphenyl)-1,3,4-oxadiazole-2-yl]benzene (hereafter, referred to as OXD-7); triazole derivatives such as 3-(4-tert-butylphenyl)-4-phenyl- 5-(4-biphenylyl)-1,2,4-triazole (hereafter, referred to as TAZ) and 3-(4-tert-butylphenyl)-4-(4-ethylphenyl)-5-(4-biphenylyl)-1,2,4-triazole (hereafter, referred to as p-EtTAZ); and phenanthroline derivatives such as bathophenanthroline (hereafter, referred to as BPhen) and bathocuproin (hereafter, referred to as BCP).

Above-mentioned materials are stacked on the electrode that serves as an anode in such order that a hole injection layer, a hole transporting layer, a light emitting layer, a hole blocking layer, and an electron transporting layer. All these layers are not necessary to be deposited, a part of which can be combined appropriately. With respect to a light emitting layer, when another layer have a light emitting property, it is not necessary to be included in the lamination structure.

The second electrode 615 should be formed with translucent materials in order to output the light generated in the electroluminescence film 614 in the present invention. Specifically, the second electrode is preferable to have 30% and more transmittance for visible light by being formed with a transparent conductive film, or a thin conductive film. In addition, the second electrode 615 serves as an anode or cathode that is different from polarity of the first electrode 611.

When the second electrode 615 serves as a cathode, low work function alkali metal or metal materials (specifically, at most 3.5 eV work function) a part of which includes alkali metal, which is described as materials for the first electrode 611, can be used in a thin film of approximately 10 to 20 nm in thick for the second electrode 615. For example, aluminum-lithium alloy (Al:Li), magnesium-silver (Mg:Ag) and a lamination of Al and LiF can be used.

On the other hand, when the second electrode 615 serves as an anode, high work function (specifically, at least 4.0 eV work function) transparent conductive film can be used for the second electrode 615. For example, indium tin oxide (ITO) film, a transparent film which an indium oxide is mixed with 2 to 20% zinc oxide (ZnO), and IZO (indium zinc oxide) can be used. In addition, the second electrode 615 is formed by evaporation since it is formed on the electroluminescence film 614.

Therefore, a light emitting panel having a light emitting element connected to a TFT on a substrate is formed.

Embodiment 2

Further, a whole appearance view of an active matrix type light-emitting device in which the light emitting panel is included described in Embodiment 1 will be described with reference to FIG. 7. Further, FIG. 7A is a top view showing the light emitting apparatus and FIG. 7B is a sectional view constituted by cutting FIG. 7A by a line A-A'. Reference numeral 701 indicated by a dotted line designates a source side driving circuit, reference numeral 702 designates a pixel portion, and reference numeral 703 designates a gate side driving circuit. Further, reference numeral 704 designates a seal substrate, reference numeral 705 designates a sealing material and an inner side surrounded by the sealing material 705 constitutes a space or resin (sealing materials) 707.

Further, reference numeral 708 designates a connection wiring for transmitting signals inputted to the source side driving circuit 701 and the gate signal line driving circuit 703 for receiving a video signal or a clock signal from FPC (flexible printed circuit) 709 for constituting an external input terminal. Further, although only FPC is illustrated here, the FPC may be attached with a printed wiring board (PWB). The light emitting apparatus in the specification includes not only a main body of the light emitting apparatus but also a state in which FPC or PWB is attached thereto.

Next, a sectional structure will be explained in reference to FIG. 7B. Driver circuits and the pixel portion are formed over a substrate 710 and here, the source side driving circuit 701 as the driver circuit and the pixel portion 702 are shown.

Further, the source signal line driving circuit 701 is formed with a CMOS circuit combined with an n-channel type TFT 723 and a p-channel type TFT 724. Further, TFT for forming the driver circuit may be formed by a known CMOS circuit, PMOS circuit or NMOS circuit. Further, although according to this embodiment, a driver integrated type formed with the driver circuits over the substrate is shown, the driver integrated type is not necessarily be needed and the driver circuits can be formed not over the substrate but at outside thereof.

Further, the pixel portion 702 is formed by a plurality of pixels each including a switching TFT 711, a current controlling TFT 712, and a first electrode (anode) 713 electrically connected to a drain of the current controlling TFT 712. An insulating layer 714 is formed to cover both side edges of the first electrode (anode) 713.

A conductive polymer layer 715 of the present invention, an electroluminescence film 716, and a second electrode (cathode) 717 are respectively formed on the first electrode 713. In addition, concerning a specific structure may be referred to Embodiment 1.

The second electrode 717 functions also as a wiring common to all the pixels and electrically connected to FPC 709 via the connection wiring 708.

Further, in order to seal the light emitting element 718 formed over the substrate 710, the seal substrate 704 is pasted by the sealing material 705. Further, a spacer comprising a resin film may be provided for ensuring an interval between the seal substrate 704 and the light emitting element 718. Further, the space 707 on the inner side of the sealing material 705 is just a space. Further, it is preferable to use epoxy species resin for the sealing material 705. Further, it is preferable that the sealing material 705 is a material for permeating moisture or oxygen as less as possible.

Further, according to this embodiment, as a material for constituting the seal substrate 704, other than glass substrate or quartz substrate, a plastic substrate comprising FRP (Fiberglass-Reinforced Plastics), PVF (polyvinyl fluoride), Mylar, polyester or acrylic resin can be used. Further, it is possible to adhere the seal substrate 704 by using the sealing material 705 and thereafter seal to cover a side face (exposed face) by a sealing material.

By sealing the light emitting element 718 in the space 707 as described above, the light emitting element can completely be blocked from outside and a substance for expediting to deteriorate the organic compound layer such as moisture or oxygen can be prevented from invading from outside. Therefore, the highly reliable light-emitting device can be provided.

Further, this embodiment can freely be combined with Embodiment Mode 1 to 4 and Embodiment 1.

Embodiment 3

The light emitting device fabricated in accordance with the present invention is of the self-emission type, and thus exhibits more excellent recognizability of the displayed image in a light place as compared to the liquid crystal display device. Furthermore, the light emitting device has a wider viewing angle. Accordingly, various electronic apparatuses can be completed by using the light emitting device of the present invention.

Such electronic apparatuses manufactured by the present invention include a video camera, a digital camera, a goggles-type display (head mount display), a navigation system, a sound reproduction device (a car audio equipment, an audio set and the like), a laptop personal computer, a game machine, a portable information terminal (a mobile computer, a cellular phone, a portable game machine, an electronic book, or the like), an image reproduction apparatus including a recording medium (more specifically, an apparatus which can reproduce a recording medium such as a digital versatile disc (DVD) and so forth, and includes a display for displaying the reproduced image), or the like. In particular, in the case of the portable information terminal, use of the light-emitting device with a light-emitting element is preferable, since the portable information terminal that is likely to be viewed from a tilted direction is often required to have a wide viewing angle. FIGS. 8A to 8H shows various specific examples of such electronic apparatus.

Figure 8A:
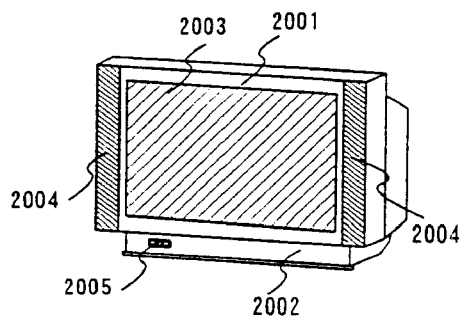
FIGS. 8A to 8H are explanatory views of electric appliances.

FIG. 8A illustrates a display device which includes a frame 2001, a support table 2002, a display portion 2003, a speaker portion 2004, a video input terminal 2005 or the like. The light-emitting device manufactured by the present invention can be used for the display portion 2003. The light emitting device is of the self-emission type and therefore requires no backlight. Thus, the display portion thereof can have a thickness thinner than that of the liquid crystal display device. The display device is including all of the display devices for displaying information, such as a personal computer, a receiver of TV broadcasting and an advertising display.

Figure 8B:
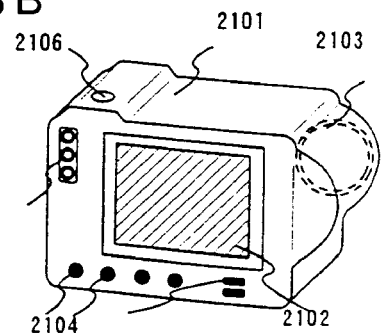

FIG. 8B illustrates a digital still camera which includes a main body 2101, a display portion 2102, an image receiving portion 2103, an operation key 2104, an external connection port 2105, a shutter 2106, or the like. The light emitting device manufactured by the present invention can be used for the display portion 2102.

Figure 8C:
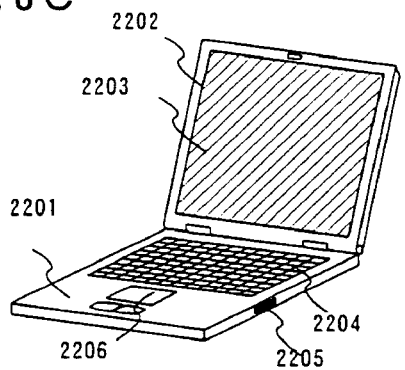

FIG. 8C illustrates a laptop type (notebook type) personal computer which includes a main body 2201, a casing 2202, a display portion 2203, a keyboard 2204, an external connection port 2205, a pointing mouse 2206, or the like. The light emitting device manufactured by the present invention can be used to the display portion 2203.

Figure 8D:
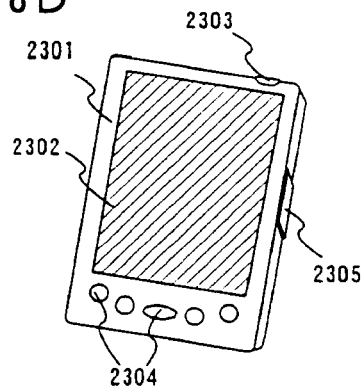

FIG. 8D illustrates a mobile computer which includes a main body 2301, a display portion 2302, a switch 2303, an operation key 2304, an infrared port 2305, or the like. The light emitting device manufactured by the present invention can be used to the display portion 2302.

Figure 8E:
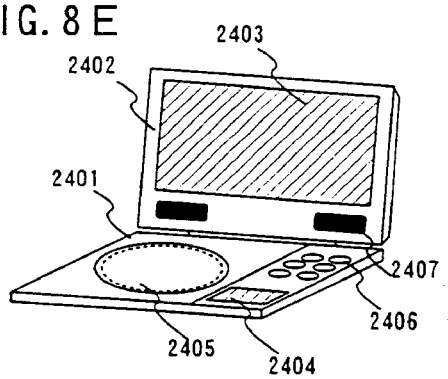

FIG. 8E illustrates an image reproduction apparatus including a recording medium (more specifically, a DVD reproduction apparatus), which includes a main body 2401, a casing 2402, a display portion A 2403, another display portion B 2404, a recording medium (DVD or the like) reading portion 2405, an operation key 2406, a speaker portion 2407 or the like. The display portion A 2403 is used mainly for displaying image information, while the display portion B 2404 is used mainly for displaying character information. The light emitting device manufactured by the present invention can be used to the display potion A 2403 and the display portion B 2404. Note that the image reproduction apparatus including a recording medium further includes a domestic game machine or the like.

Figure 8F:
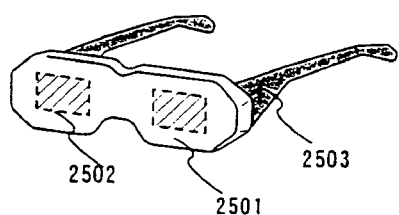

FIG. 8F illustrates a goggle type display (head mounted display) which includes a main body 2501, a display portion 2502, an arm portion 2503. The light emitting device manufactured by the present invention can be used to the display portion 2502.

Figure 8G:
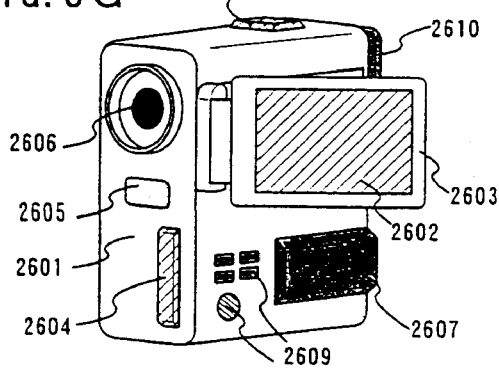

FIG. 8G illustrates a video camera which includes a main body 2601, a display portion 2602, an casing 2603, an external connecting port 2604, a remote control receiving portion 2605, an image receiving portion 2606, a battery 2607, a sound input portion 2608, an operation key 2609, an eyepiece potion 2610 or the like. The light emitting device manufactured by the present invention can be used to the display portion 2602.

Figure 8H:
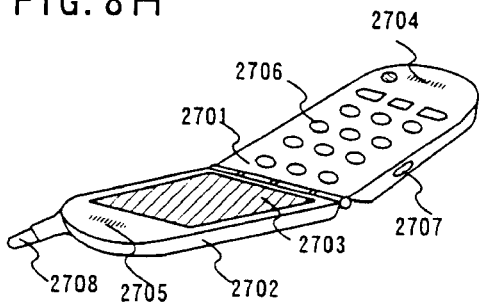

FIG. 8H illustrates a cellular phone which includes a main body 2701, a casing 2702, a display portion 2703, a sound input portion 2704, a sound output portion 2705, an operation key 2706, an external connecting port 2707, an antenna 2708, or the like. The light-emitting device manufactured by the present invention can be used to the display portion 2703. Note that the display portion 2703 can reduce power consumption of the cellular phone by displaying white-colored characters on a black-colored background.

When the brighter luminance of the organic material becomes available in the future, the light-emitting device manufactured by the present invention will be applicable to a front-type or rear-type projector in which light including output image information is enlarged by means of lenses or the like to be projected.

The aforementioned electronic apparatuses are more likely to be used for display information distributed through a tele-communication path such as Internet, a CATV (cable television system), and in particular likely to display moving image information. The light-emitting device is suitable for displaying moving images since the organic material can exhibit a high response speed.

A portion of the light-emitting device that is emitting light consumes power so it is desirable to display information in such a manner that the light-emitting portion therein becomes as small as possible. Accordingly, when the light-emitting device is applied to a display portion which mainly displays character information, e.g., a display portion of a portable information terminal, and more particular, a cellular phone or a sound reproduction device, it is desirable to drive the light-emitting device so that the character information is formed by a light-emitting portion while a non-emission portion corresponds to the background.

As set forth above, the light-emitting device formed by using the present invention can be applied variously to a wide range of electronic apparatuses in all fields. The electronic apparatuses in this embodiment can be completed by using a light-emitting device shown in Embodiment Mode 1 to 4 and Embodiments 1 and 2.

According as the present invention is embodied, the active matrix light emitting device can be manufactured with the top emission structure, which is free of problems concerning the opening ratio. Also, the conductive polymer layer is formed in contact with the first electrode of the light emitting element included in the light emitting device, which makes it possible to enhance the property of injecting the carrier from the first electrode. As a result, the device can be manufactured without particularly considering the ionization potential upon the selection of the materials for the first electrode. Consequently, the selection range of materials can be widened, whereby the highly efficient light emitting device can be manufactured at low costs.

What is claimed is:

1. A method of manufacturing an active matrix light emitting device comprising:
    forming a thin film transistor over a substrate;
    forming a first electrode over the thin film transistor;
    forming a conductive polymer layer over the first electrode;
    forming an electroluminescence film over the conductive polymer layer; and forming a second electrode over the electroluminescence film, wherein the conductive polymer layer comprises a redox polymer; and wherein the second electrode comprises a transparent conductive film.

2. The method according to claim 1, wherein the conductive polymer layer includes emeraldine base polyaniline.

3. The method according to claim 1, wherein the electroluminescence film includes a hole transporting layer and an electron transporting layer;

wherein the conductive polymer layer is formed in contact with the hole transporting layer; and wherein the second electrode functions as a cathode.

4. The method according to claim 1, wherein the electroluminescence film includes a hole transporting layer and an electron transporting layer;

wherein the conductive polymer layer is formed in contact with the electron transporting layer; and wherein the second electrode functions as an anode.

5. The method according to claim 1, wherein said light emitting device is applied to an electronic apparatus selected from a display device, a personal computer, a mobile computer, an image reproduction apparatus, a goggle type display, a video camera, a cellular phone, a navigation system.

6. A method of manufacturing an active matrix light emitting device comprising:

forming a thin film transistor over a substrate;

forming a first electrode over the substrate;

forming a conductive polymer layer over the first electrode;

forming an electroluminescence film over the conductive polymer layer; and forming a second electrode over the electroluminescence film, wherein the first electrode functions as an anode;

wherein the conductive polymer layer comprises a conductive polymer material doped with an acceptor material; and wherein the second electrode comprises a transparent conductive film.

7. The method according to claim 6, wherein the conductive polymer layer includes polyethylene dioxythiophene and polystyrene sulfonate.

8. The method according to claim 6, wherein the electroluminescence film includes a hole transporting layer and an electron transporting layer;

wherein the conductive polymer layer is formed in contact with the hole transporting layer; and wherein the second electrode functions as a cathode.

9. The method according to claim 6, wherein the first electrode comprises an element selected from the group consisting of aluminum, tantalum, tungsten, titanium, molybdenum, nickel, copper, chromium, silver, titanium nitride, tantalum nitride, zirconium nitride, molybdenum nitride, chromium nitride, and tungsten nitride.

10. The method according to claim 6, wherein said light emitting device is applied to an electronic apparatus selected from a display device, a personal computer, a mobile computer, an image reproduction apparatus, a goggle type display, a video camera, a cellular phone, a navigation system.

11. A method of manufacturing an active matrix light emitting device comprising:

forming a thin film transistor over a substrate;

forming a first electrode over the thin film transistor;

forming a conductive polymer layer over the first electrode;

forming an electroluminescence film over the conductive polymer layer; and forming a second electrode over the electroluminescence film, wherein the first electrode functions as a cathode;

wherein the conductive polymer layer comprises a conductive polymer material doped with a donor material; and wherein the second electrode comprises a transparent conductive film.

12. The method according to claim 11, wherein the conductive polymer layer includes emeraldine base polyaniline and tetrathiafluvalene.

13. The method according to claim 11, wherein the electroluminescence film includes a hole transporting layer and an electron transporting layer;

wherein the conductive polymer layer is formed in contact with the electron transporting layer; and wherein the second electrode functions as an anode.

14. The method according to claim 11, wherein said light emitting device is applied to an electronic apparatus selected from a display device, a personal computer, a mobile computer, an image reproduction apparatus, a goggle type display, a video camera, a cellular phone, a navigation system.

15. A method of manufacturing an active matrix light emitting device comprising:

forming a thin film transistor over a substrate;

forming a first electrode over the thin film transistor;

forming a conductive polymer layer over the first electrode;

forming an electroluminescence film over the conductive polymer layer; and forming a second electrode over the electroluminescence film, wherein the conductive polymer layer comprises a redox polymer;

wherein the second electrode comprises a transparent conductive film; and wherein the first electrode has light blocking effects or light reflecting effects.

16. The method according to claim 15, wherein the conductive polymer layer includes emeraldine base polyaniline.

17. The method according to claim 15, wherein the electroluminescence film includes a hole transporting layer and an electron transporting layer;

wherein the conductive polymer layer is formed in contact with the hole transporting layer; and wherein the second electrode functions as a cathode.

18. The method according to claim 15, wherein the electroluminescence film includes a hole transporting layer and an electron transporting layer;

wherein the conductive polymer layer is formed in contact with the electron transporting layer; and wherein the second electrode functions as an anode.

19. The method according to claim 15, wherein said light emitting device is applied to an electronic apparatus selected from a display device, a personal computer, a mobile computer, an image reproduction apparatus, a goggle type display, a video camera, a cellular phone, a navigation system.

20. A method of manufacturing an active matrix light emitting device comprising:

forming a thin film transistor over a substrate;

forming a first electrode over the thin film transistor;

forming a conductive polymer layer over the first electrode;

forming an electroluminescence film over the conductive polymer layer; and forming a second electrode over the electroluminescence film,
wherein the first electrode functions as an anode;
wherein the conductive polymer layer comprises a conductive polymer material doped with an acceptor material;
wherein the second electrode comprises a transparent conductive film; and
wherein the first electrode has light blocking effects or light reflecting effects.

21. The method according to claim 20, wherein the conductive polymer layer includes polyethylene dioxythiophene and polystyrene sulfonate.

22. The method according to claim 20,
wherein the electroluminescence film includes a hole transporting layer and an electron transporting layer;
wherein the conductive polymer layer is formed in contact with the hole transporting layer; and
wherein the second electrode functions as a cathode.

23. The method according to claim 20, wherein the first electrode comprises an element selected from the group consisting of aluminum, tantalum, tungsten, titanium, molybdenum, nickel, copper, chromium, silver, titanium nitride, tantalum nitride, zirconium nitride, molybdenum nitride, chromium nitride, and tungsten nitride.

24. The method according to claim 20, wherein said light emitting device is applied to an electronic apparatus selected from a display device, a personal computer, a mobile computer, an image reproduction apparatus, a goggle type display, a video camera, a cellular phone, a navigation system.

25. A method of manufacturing an active matrix light emitting device comprising:
forming a thin film transistor over a substrate;
forming a first electrode over the thin film transistor;
forming a conductive polymer layer over the first electrode;
forming an electroluminescence film over the conductive polymer layer; and
forming a second electrode over the electroluminescence film,
wherein the first electrode functions as a cathode;
wherein the conductive polymer layer comprises a conductive polymer material doped with a donor material;
wherein the second electrode comprises a transparent conductive film; and
wherein the first electrode has light blocking effects or light reflecting effects.

26. The method according to claim 25, wherein the conductive polymer layer includes emeraldine base polyaniline and tetrathiafluvalene.

27. The method according to claim 25,
wherein the electroluminescence film includes a hole transporting layer and an electron transporting layer;
wherein the conductive polymer layer is formed in contact with the electron transporting layer; and
wherein the second electrode functions as an anode.

28. The method according to claim 25, wherein said light emitting device is applied to an electronic apparatus selected from a display device, a personal computer, a mobile computer, an image reproduction apparatus, a goggle type display, a video camera, a cellular phone, a navigation system.

29. A method of manufacturing a light emitting device comprising:
forming a first electrode over a substrate;
forming a conductive polymer layer over the first electrode;
forming an electroluminescence film over the conductive polymer layer; and
forming a second electrode over the electroluminescence film,
wherein the conductive polymer layer comprises a redox polymer; and
wherein the second electrode comprises a transparent conductive film.

30. The method according to claim 29, wherein the conductive polymer layer includes emeraldine base polyaniline.

31. The method according to claim 29,
wherein the electroluminescence film includes a hole transporting layer and an electron transporting layer;
wherein the conductive polymer layer is formed in contact with the hole transporting layer; and
wherein the second electrode functions as a cathode.

32. The method according to claim 29,
wherein the electroluminescence film includes a hole transporting layer and an electron transporting layer;
wherein the conductive polymer layer is formed in contact with the electron transporting layer; and
wherein the second electrode functions as an anode.

33. The method according to claim 29, wherein said light emitting device is applied to an electronic apparatus selected from a display device, a personal computer, a mobile computer, an image reproduction apparatus, a goggle type display, a video camera, a cellular phone, a navigation system.

34. A method of manufacturing a light emitting device comprising:
forming a first electrode over a substrate;
forming a conductive polymer layer over the first electrode;
forming an electroluminescence film over the conductive polymer layer; and
forming a second electrode over the electroluminescence film,
wherein the first electrode functions as an anode;
wherein the conductive polymer layer comprises a conductive polymer material doped with an acceptor material; and
wherein the second electrode comprises a transparent conductive film.

35. The method according to claim 34, wherein the conductive polymer layer includes polyethylene dioxythiophene and polystyrene sulfonate.

36. The method according to claim 34,
wherein the electroluminescence film includes a hole transporting layer and an electron transporting layer;
wherein the conductive polymer layer is formed in contact with the hole transporting layer; and
wherein the second electrode functions as a cathode.

37. The method according to claim 34, wherein the first electrode comprises an element selected from the group consisting of aluminum, tantalum, tungsten, titanium, molybdenum, nickel, copper, chromium, silver, titanium nitride, tantalum nitride, zirconium nitride, molybdenum nitride, chromium nitride, and tungsten nitride.

38. The method according to claim 34, wherein said light emitting device is applied to an electronic apparatus selected from a display device, a personal computer, a mobile computer, an image reproduction apparatus, a goggle type display, a video camera, a cellular phone, a navigation system.

39. A method of manufacturing a light emitting device comprising:
forming a first electrode over a substrate;
forming a conductive polymer layer over the first electrode;
forming an electroluminescence film over the conductive polymer layer; and forming a second electrode over the electroluminescence film, wherein the first electrode functions as a cathode;

wherein the conductive polymer layer comprises a conductive polymer material doped with a donor material; and wherein the second electrode comprises a transparent conductive film.

40. The method according to claim 39, wherein the conductive polymer layer includes emeraldine base polyaniline and tetrathiafluvalene.

41. The method according to claim 39, wherein the electroluminescence film includes a hole transporting layer and an electron transporting layer;

wherein the conductive polymer layer is formed in contact with the electron transporting layer; and wherein the second electrode functions as an anode.

42. The method according to claim 39, wherein said light emitting device is applied to an electronic apparatus selected from a display device, a personal computer, a mobile computer, an image reproduction apparatus, a goggle type display, a video camera, a cellular phone, a navigation system.

43. A method of manufacturing a light emitting device comprising:

forming a first electrode over a substrate;

forming a conductive polymer layer over the first electrode;

forming an electroluminescence film over the conductive polymer layer; and forming a second electrode over the electroluminescence film, wherein the conductive polymer layer comprises a redox polymer;

wherein the second electrode comprises a transparent conductive film; and wherein the first electrode has light blocking effects or light reflecting effects.

44. The method according to claim 43, wherein the conductive polymer layer includes emeraldine base polyaniline.

45. The method according to claim 43, wherein the electroluminescence film includes a hole transporting layer and an electron transporting layer;

wherein the conductive polymer layer is formed in contact with the hole transporting layer; and wherein the second electrode functions as a cathode.

46. The method according to claim 43, wherein the electroluminescence film includes a hole transporting layer and an electron transporting layer;

wherein the conductive polymer layer is formed in contact with the electron transporting layer; and wherein the second electrode functions as an anode.

47. The method according to claim 43, wherein said light emitting device is applied to an electronic apparatus selected from a display device, a personal computer, a mobile computer, an image reproduction apparatus, a goggle type display, a video camera, a cellular phone, a navigation system.

48. A method of manufacturing a light emitting device comprising:

forming a first electrode over a substrate;

forming a conductive polymer layer over the first electrode;

forming an electroluminescence film over the conductive polymer layer; and forming a second electrode over the electroluminescence film, wherein the first electrode functions as an anode;

wherein the conductive polymer layer comprises a conductive polymer material doped with an acceptor material;

wherein the second electrode comprises a transparent conductive film; and wherein the first electrode has light blocking effects or light reflecting effects.

49. The method according to claim 48, wherein the conductive polymer layer includes polyethylene dioxythiophene and polystyrene sulfonate.

50. The method according to claim 48, wherein the electroluminescence film includes a hole transporting layer and an electron transporting layer;

wherein the conductive polymer layer is formed in contact with the hole transporting layer; and wherein the second electrode functions as a cathode.

51. The method according to claim 48, wherein the first electrode comprises an element selected from the group consisting of aluminum, tantalum, tungsten, titanium, molybdenum, nickel, copper, chromium, silver, titanium nitride, tantalum nitride, zirconium nitride, molybdenum nitride, chromium nitride, and tungsten nitride.

52. The method according to claim 48, wherein said light emitting device is applied to an electronic apparatus selected from a display device, a personal computer, a mobile computer, an image reproduction apparatus, a goggle type display, a video camera, a cellular phone, a navigation system.

53. A method of manufacturing a light emitting device comprising:

forming a first electrode over a substrate;

forming a first electrode over the substrate;

forming a conductive polymer layer over the first electrode;

forming an electroluminescence film over the conductive polymer layer; and forming a second electrode over the electroluminescence film, wherein the first electrode functions as a cathode;

wherein the conductive polymer layer comprises a conductive polymer material doped with a donor material;

wherein the second electrode comprises a transparent conductive film; and wherein the first electrode has light blocking effects or light reflecting effects.

54. The method according to claim 53, wherein the conductive polymer layer includes emeraldine base polyaniline and tetrathiafluvalene.

55. The method according to claim 53, wherein the electroluminescence film includes a hole transporting layer and an electron transporting layer;

wherein the conductive polymer layer is formed in contact with the electron transporting layer; and wherein the second electrode functions as an anode.

56. The method according to claim 53, wherein said light emitting device is applied to an electronic apparatus selected from a display device, a personal computer, a mobile computer, an image reproduction apparatus, a goggle type display, a video camera, a cellular phone, a navigation system.

* * * * *